(12) United States Patent
Kin et al.

(10) Patent No.: US 10,029,328 B2
(45) Date of Patent: Jul. 24, 2018

(54) METAL WIRING BONDING STRUCTURE AND PRODUCTION METHOD THEREFOR

(71) Applicant: NGK INSULATORS, LTD., Nagoya (JP)

(72) Inventors: Rishun Kin, Handa (JP); Hiroshi Takebayashi, Handa (JP); Natsuki Hirata, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/461,930

(22) Filed: Mar. 17, 2017

(65) Prior Publication Data

US 2017/0282286 A1    Oct. 5, 2017

Related U.S. Application Data

(60) Provisional application No. 62/314,556, filed on Mar. 29, 2016, provisional application No. 62/314,547, filed on Mar. 29, 2016.

(30) Foreign Application Priority Data

Jun. 29, 2016  (JP) ................................. 2016-128765
Jun. 29, 2016  (JP) ................................. 2016-128766

(51) Int. Cl.
*B23K 1/00* (2006.01)
*H01L 21/00* (2006.01)
(Continued)

(52) U.S. Cl.
CPC .......... *B23K 20/004* (2013.01); *B23K 1/0016* (2013.01); *H01L 21/67103* (2013.01); *H01L 21/6831* (2013.01); *H01L 21/6833* (2013.01); *H05B 3/62* (2013.01); *H05K 1/028* (2013.01); *H05K 1/118* (2013.01); *B23K 2201/42* (2013.01); *H01L 21/67069* (2013.01)

(58) Field of Classification Search
CPC ... H01L 23/049; H01L 23/055; H01L 23/145; H01L 23/4824; H01L 23/49833; H01L 24/02; H01L 24/06; H01L 24/17; H01L 24/33; B23K 20/004; B23K 2201/40; B23K 1/0008
See application file for complete search history.

(56) References Cited

FOREIGN PATENT DOCUMENTS

JP         05-090725 A1    4/1993

OTHER PUBLICATIONS

U.S. Appl. No. 15/461,902, filed Mar. 17, 2017, Hiroshi Takebayashi.

*Primary Examiner* — Erin B Saad
(74) *Attorney, Agent, or Firm* — Burr & Brown, PLLC (57) ABSTRACT

A metal wiring bonding structure 100 comprises contacts 753 of connection FPC 75 and heater lands 46 of a sheet heater 30 to be bonded by a solder bonding member 766. A connection FPC 75 includes contact opposed lands 754 formed of metal and disposed at positions respectively opposed to the plurality of contacts 753 on a surface of a support layer 751 opposite from a surface on which metal wires 750 are provided. In addition to base surfaces 461 opposed to the contacts 753, the heater lands 46 respectively include extended surfaces 462 opposed to imaginary extended portions 753*b* imaginarily extended ahead from the contacts 753. A solder bonding member 756 covers surfaces of the contact opposed lands 754, a distal end surface of the connection FPC 75, and the extended surfaces 462 of the heater lands 46, and is filled in a bonding space C.

5 Claims, 8 Drawing Sheets (51) Int. Cl.
*H01L 23/00* (2006.01)
*B23K 20/00* (2006.01)
*H01L 21/683* (2006.01)
*H05K 1/02* (2006.01)
*H05K 1/11* (2006.01)
*H01L 21/67* (2006.01)
*H05B 3/62* (2006.01)
*B23K 101/42* (2006.01)

METAL WIRING BONDING STRUCTURE AND PRODUCTION METHOD THEREFOR

The present application claims priority from U.S. Provisional Application No. 62/314,547 and U.S. Provisional Application No. 62/314,556, filed on Mar. 29, 2016, and Japanese Patent Application No. 2016-128765 and Japanese Patent Application No. 2016-128766, filed on Jun. 29, 2016, the entire contents of which are incorporated herein by reference.

BACKGROUND OF THE INVENTION

1. Field of the Invention

The present invention relates to a metal wiring bonding structure and a production method therefor.

2. Description of the Related Art

Figure 9:
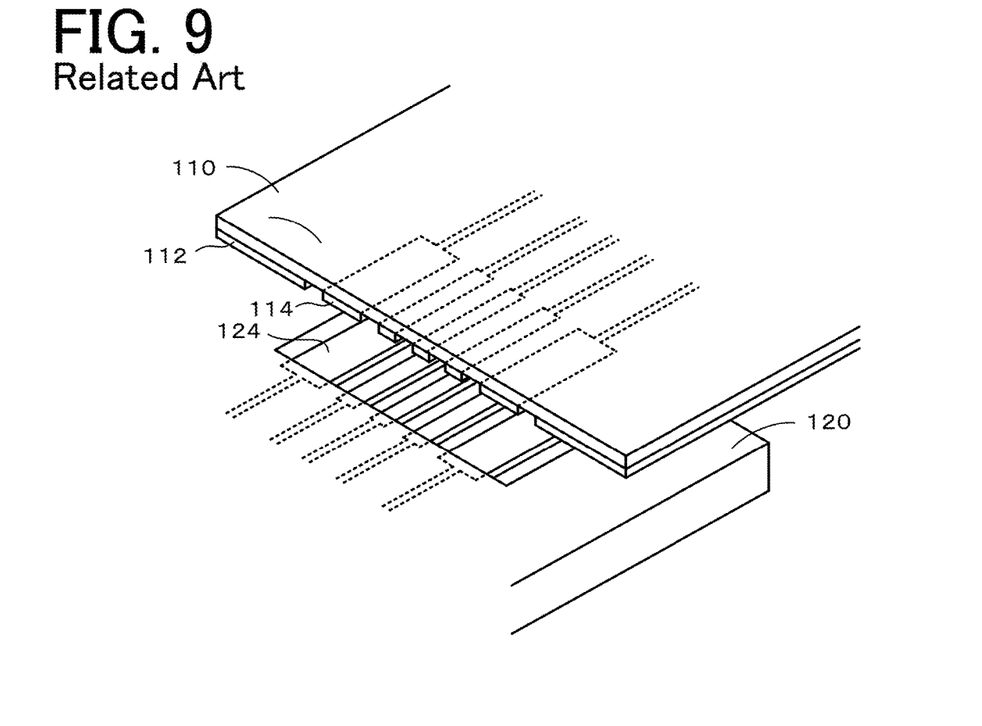
FIG. 9 is a perspective view of a conventional metal wiring bonding structure.

In a conventionally known structure for bonding a flexible board and a printed board, a contact part, such as a contact pattern, on the flexible board and a corresponding contact part on the printed board are electrically connected by soldering (for example, PTL 1). FIG. 9 illustrates an example of such a bonding structure. A coverlay film 112 is removed from a board end of a flexible board 110, where end portions of copper foil patterns arranged in parallel at a fixed pitch are exposed as a contact pattern 114. The contact pattern 114 is superposed on a contact pattern 124 provided on a printed board 120, and is electrically connected thereto by melting solder attached beforehand to a surface of at least one of the contact pattern 114 and the contact pattern 124.

CITATION LIST

Patent Literature

PTL 1: JP 5-90725 A

SUMMARY OF THE INVENTION

However, in the bonding structure of FIG. 9, since the position of the contact pattern 114 cannot be checked from above the flexible board 110, it is difficult to accurately align the contact pattern 114 and the contact pattern 124. Also, when the solder is melted, heat does not spread over the entire solder, and this sometimes causes connection failure.

The present invention has been made to solve the above-described problems, and a main object of the invention is to provide a metal wiring bonding structure in which a first member having first contacts and a second member having second contacts are properly bonded together.

The present invention provides a metal wiring bonding structure including:
  a first member having a plurality of first metal wires between a first support layer farmed of resin and a first covering layer formed of resin, and first contacts serving as end portions of the first metal wires and exposed from the first covering layer;
  a second member having a plurality of second contacts on a surface of a second support layer famed of resin, the second contacts being disposed respectively opposed to the plurality of first contacts; and
  a bonding member that brazes and solders the first contacts and the second contacts,
  wherein the first member includes first contact opposed lands formed of metal and disposed at positions respectively opposed to the plurality of first contacts on a surface of the first support layer opposite from a surface on which the first metal wires are provided,
  the second contacts respectively include extended surfaces opposed to imaginary extended portions imaginarily extended ahead from the first contacts in addition to base surfaces opposed to the first contacts, and
  the bonding member covers surfaces of the first contact opposed lands, a distal end surface of the first member, and the extended surfaces of the second contacts, and is filled in a bonding space between the first contacts and the second contacts.

In this metal wiring bonding structure, since portions of the bonding member that cover the surfaces of the first contact opposed lands and the distal end surface of the first member can be inspected from the outside, the connection state can be checked easily, and bonding members in a good contact state can be selected. Further, in a case in which the first contacts of the first member are positioned to be opposed to the second contacts of the second member, when the first member is placed on the second member, the extended surfaces of the second contacts and the first contact opposed lands are both seen from above the first member. Hence, positioning can be easily performed by utilizing the first contact opposed lands and the extended surfaces of the second contacts. In this way, bonding members in a good connection state can be selected by inspection from the outside, and the first contacts and the second contacts can be aligned easily. Therefore, it is possible to provide the metal wiring bonding structure in which the first member having the first contacts and the second member having the second contacts are properly bonded. Here, the term "brazing and soldering" refers to soldering (the melting temperature is less than 450° C.) and brazing (the melting temperature is 450° C. or more).

In the metal wiring bonding structure of the present invention, the first contact opposed lands may extend to the distal end surface of the first member. This allows the melted solder to be easily supplied from the first contact opposed lands to the bonding space via the distal end surface of the first member and the extended surface of the second contacts.

In the metal wiring bonding structure of the present invention, the first member may be a flexible printed circuit board (FPC). This enables firm bonding of the first contacts of the FPC and the second contacts of the second member.

In the metal wiring bonding structure of the present invention, the second member may be a sheet heater functioning as a heater and disposed between an electrostatic chuck and a support pedestal formed of metal, and the first member may be inserted in a through hole of the support pedestal to be bonded to the second member. In this case, in an electrostatic chuck heater in which the sheet heater is disposed between the electrostatic chuck and the support pedestal, the first contacts of the first member and the second contacts of the sheet heater can be bonded firmly.

The present invention provides a production method for a metal wiring bonding structure, including:
  (a) a step of preparing a first member having a plurality of first metal wires between a first support layer formed of resin and a first covering layer formed of resin, first contacts serving as end portions of the first metal wires and exposed from the first covering layer, and first contact opposed lands formed of metal and disposed at positions respectively opposed to the plurality of first contacts on a surface of the first support layer opposite from a surface on which the first metal wires are provided, and a second member having a plurality of second contacts on a surface of a second support layer formed of resin, the second contacts including extended surfaces opposed to imaginary extended portions imaginarily extended ahead from the first contacts in addition to base surfaces opposed to the first contacts when the second contacts are opposed to the first contacts, (b) a step of placing the first member on the second member and aligning the first member and the second member so that the first contacts are opposed to the base surfaces of the second contacts by utilizing the first contact opposed lands and the extended surfaces of the second contacts, (c) a step of heating and melting a brazing and soldering material in contact with the first contact opposed lands, supplying the melted brazing and soldering material from the first contact opposed lands to a bonding space between the first contacts and the second contacts through a distal end surface of the first member and the extended surfaces of the second contacts, and in case the first contacts and the second contacts are temporarily bonded with a preliminary brazing and soldering material beforehand, melting the preliminary brazing and soldering material by heat transfer; and (d) a step of hardening the entire brazing and soldering material.

In this production method for the metal wiring bonding structure, the first member is placed on the second member, and the first member and the second member are aligned by utilizing the first contact opposed lands and the extended surfaces of the second contacts so that the first contacts are opposed to the base surfaces of the second contacts. The first contacts are provided on a back side of the first contact opposed lands, and the base surfaces are provided to continue from the extended surfaces of the second contacts. Moreover, the first contact opposed lands and the extended surfaces of the second contacts can both be checked from above the first member. For this reason, alignment can be easily performed by utilizing the first contact opposed lands and the extended surfaces of the second contacts so that the first contacts are opposed to the base surfaces of the second contacts. Further, the bonding member formed by hardening the melted brazing and soldering material covers the surfaces of the first contact opposed lands, the distal end surface of the first member, and the extended surfaces of the second contacts, and is filled in the bonding space between the first contacts and the second contacts. Since portions of the bonding member that cover the surfaces of the first contact opposed lands and the distal end surface of the first member can be inspected from the outside, the connection state can be easily checked, and bonding members in a good connection state can be selected. In this way, bonding members in the good connection state can be selected by inspection from the outside, and the first contacts and the second contacts can be aligned easily. Therefore, it is possible to provide the metal wiring bonding structure in which the first member having the first contacts and the second member having the second contacts are properly bonded.

DETAILED DESCRIPTION OF THE INVENTION

Figure 1:
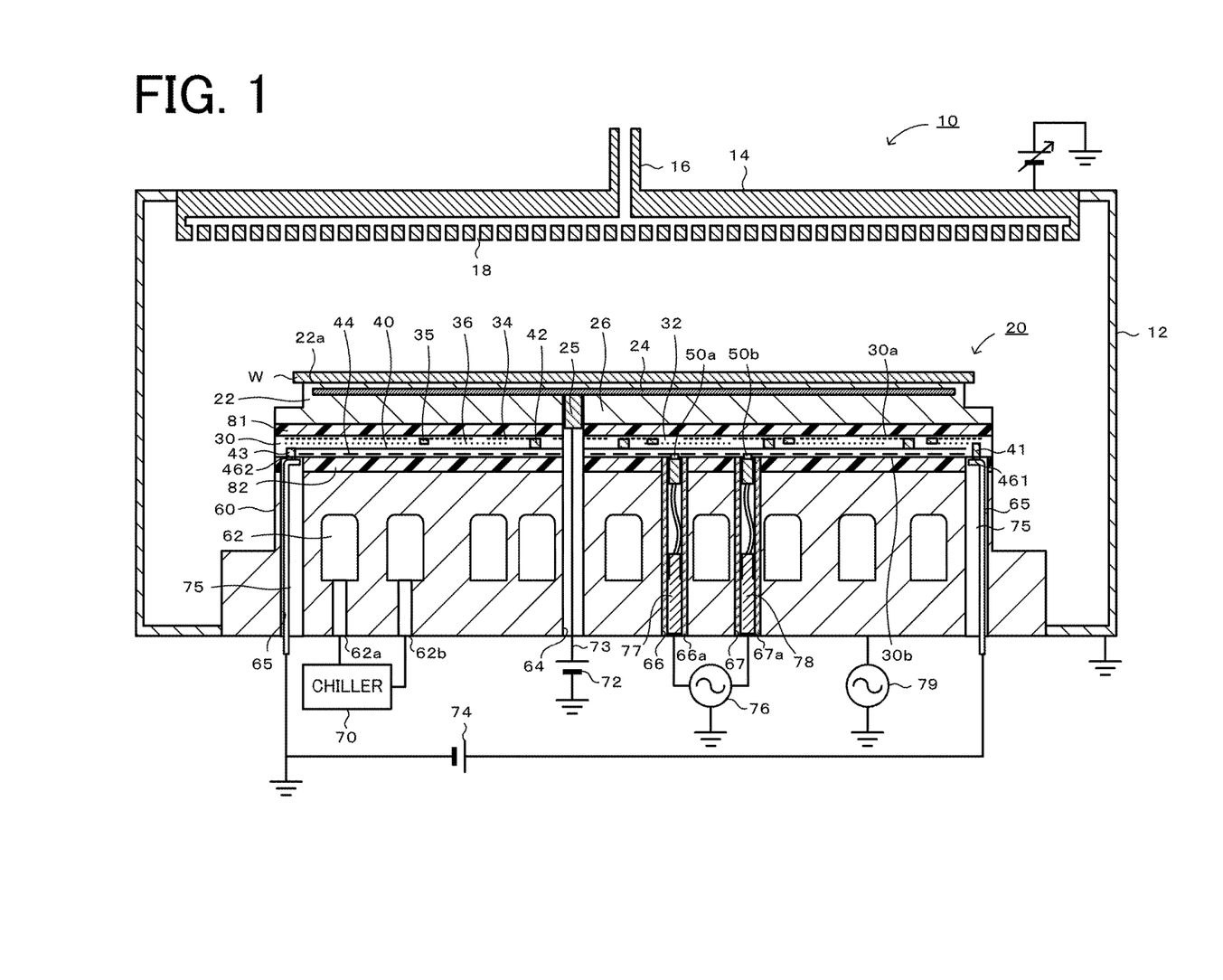
FIG. 1 is a cross-sectional view illustrating a schematic configuration of a plasma treatment apparatus 10.
Figure 2:
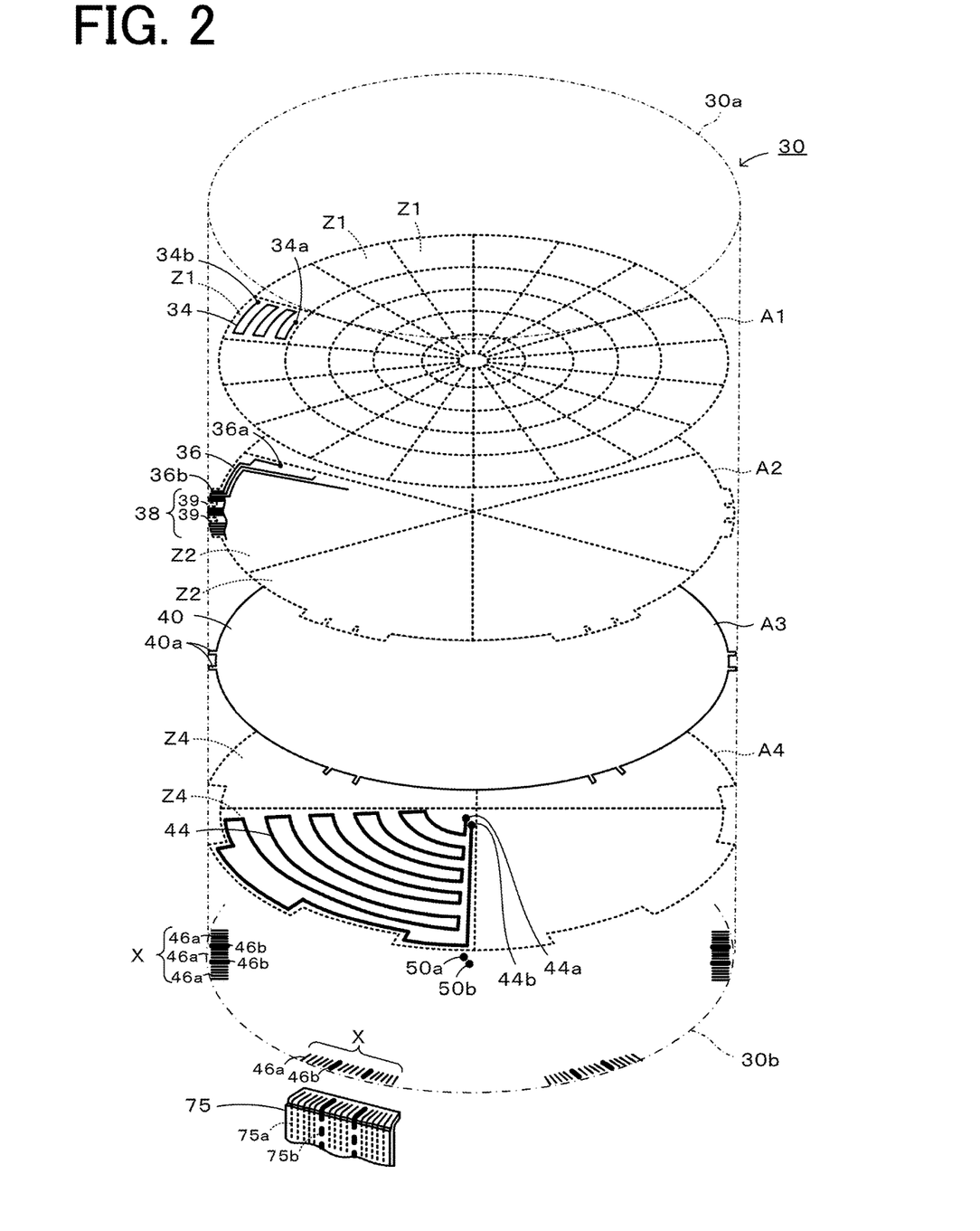
FIG. 2 is a perspective view illustrating an internal structure of a sheet heater 30.

A preferred embodiment of the present invention will be described below with reference to the drawings. FIG. 1 is a cross-sectional view illustrating a schematic configuration of a plasma treatment apparatus 10, and FIG. 2 is a perspective view illustrating an internal structure of a sheet heater 30.

As illustrated in FIG. 1, the plasma treatment apparatus 10 serving as a semiconductor manufacturing apparatus includes a vacuum chamber 12, a shower head 14, and an electrostatic chuck heater 20. The vacuum chamber 12 is a box-shaped container formed of, for example, an aluminum alloy. The shower head 14 is provided in a ceiling surface of the vacuum chamber 12. The shower head 14 releases process gas supplied from a gas introduction pipe 16 into the vacuum chamber 12 through multiple gas injection ports 18. Also, the shower head 14 functions as a cathode plate for plasma generation. The electrostatic chuck heater 20 is a device that attracts and holds a wafer W on a wafer mounting surface 22a. Hereinafter, the electrostatic chuck heater 20 will be described in detail.

The electrostatic chuck heater 20 includes an electrostatic chuck 22, a sheet heater 30, and a support pedestal 60. A lower surface of the electrostatic chuck 22 and an upper surface 30a of the sheet heater 30 are bonded together with a first bonding shoot 81 interposed therebetween. An upper surface of the support pedestal 60 and a lower surface 30b of the sheet heater 30 are bonded together with a second bonding sheet 82 interposed therebetween. Examples of the bonding sheets 81 and 82 include a sheet in which an acrylic resin layer is provided on each surface of a core material formed of polypropylene, a sheet in which a silicone resin layer is provided on each surface of a core material formed of polyimide, and a sheet formed of epoxy resin alone.

The electrostatic chuck 22 is a disc-shaped member in which an electrostatic electrode 24 is embedded in a ceramic sintered body 26. Examples of the ceramic sintered body 26 include an aluminum nitride sintered body and an alumina sintered body. An upper surface of the electrostatic chuck 22 serves as a wafer mounting surface 22a on which a wafer W is mounted. The thickness of the ceramic sintered body 26 is preferably 0.5 to 4 mm, although not particularly limited.

The sheet heater 30 is a disc-shaped member in which correction heater electrodes 34, jumper lines 36, a ground electrode 40, and reference heater electrodes 44 are built in a heat-resistant resin sheet 32. Examples of the material of the resin sheet 32 include polyimide resin and a liquid crystal polymer. The sheet heater 30 includes a first electrode region A1 to a fourth electrode region A4 provided parallel to the upper surface 30a of the sheet heater 30 and having different heights (see FIG. 2).

A first electrode region A1 is divided into multiple zones Z1 (for example, 100 zones or 300 zones). In each of the zones Z1, a correction heater electrode 34 is routed all over the zone Z1 from one end 34a to the other end 34b in the shape of a single brush stroke. In FIG. 2, imaginary lines are drawn by dotted lines in the first electrode region A1, and portions surrounded by the imaginary lines are referred to as zones Z1. While the correction heater electrode 34 is shown only in one zone Z1 in FIG. 2 for convenience, similar correction heater electrodes 34 are provided in the other zones Z1. The outer shape of the sheet heater 30 is shown by one-dot chain lines.

In a second electrode region A2, jumper lines 36 are provided to respectively supply power to the plural correction heater electrodes 34. For this reason, the number of jumper lines 36 is equal to the number of correction heater electrodes 34. The second electrode region A2 is divided into a number of zones Z2 smaller than the number of zones Z1 (for example, 6 zones or 8 zones). In FIG. 2, imaginary lines are drawn by dotted lines in the second electrode region A2, and portions surrounded by the imaginary lines are referred to as zones Z2. While a jumper line 36 (a part) is shown only in one zone Z2 for convenience in FIG. 2, similar jumper lines 36 are provided in the other zones Z2. In the description of the embodiment, it is assumed that, when one zone Z2 is projected onto the first electrode region A1, a plurality of correction heater electrodes 34 included in the projection area belong to the same group. One end 34a of each of the correction heater electrodes 34 belonging to one group is connected to one end 36a of the jumper line 36 in the zone Z2 corresponding to the group through a via 35 penetrating a portion between the first electrode region A1 and the second electrode region A2 in the up-down direction (see FIG. 1). The other end 36b of the jumper line 36 is extended out to an outer peripheral region 38 provided in the zone Z2. As a result, the other ends 36b of the jumper lines 36 connected to the correction heater electrodes 34 belonging to the same group are collectively disposed in one outer peripheral region 38. In regions X where outer peripheral regions 38 are projected onto the lower surface 30b of the sheet heater 30, jumper lands 46a connected to the other ends 36b of the jumper lines 36 through vias 41 (see FIG. 1) are arranged side by side. In other words, the plural jumper lands 46a are arranged in the same region X and exposed outside so that two or more jumper lands 46a form a group. The specific resistance of the correction heater electrodes 34 is preferably higher than or equal to the specific resistance of the jumper lines 36.

In a third electrode region A3, a ground electrode 40 common to the plural correction heater electrodes 34 is provided. The correction heater electrodes 34 are connected to the ground electrode 40 through vias 42 extending from the first electrode region A1 to the third electrode region A3 through the second electrode region A2 (see FIG. 1). The ground electrode 40 has projections 40a projecting outward from the outer periphery. These projections 40a are provided at positions opposed to cutouts 39 in the corresponding outer peripheral regions 38. The projections 40a are connected to ground lands 46b provided on the lower surface 30b of the sheet heater 30 through vias 43 (see FIG. 1). The ground lands 46b are provided together with the jumper lands 46a in the region X of the lower surface 30b of the sheet heater 30.

A fourth electrode region A4 is divided into a number of zones Z4 smaller than the total number of correction heater electrodes 34 provided in the first electrode region A1 (for example, 4 zones or 6 zones). In each of the zones Z4, a reference heater electrode 44 of an output higher than that of the correction heater electrodes 34 is routed over the entire zone Z4 from one end 44a to the other end 44b in the shape of a single brush stroke. In FIG. 2, imaginary lines are drawn by dotted lines in the fourth electrode region A4, and portions surrounded by the imaginary lines are referred to as zones Z4. While the reference heater electrode 44 is shown only in one zone Z4 for convenience in FIG. 2, similar reference heater electrodes 44 are also provided in the other zones Z4. Both ends 44a and 44b of each of the reference heater electrodes 44 are connected to a pair of reference lands 50a and 50b provided on the lower surface 30b of the sheet heater 30 through unillustrated vias extending from the fourth electrode region A4 to the lower surface 30b of the sheet heater 30.

As illustrated in FIG. 1, the support pedestal 60 is a disc-shaped member formed of metal such as Al or an Al alloy, and a refrigerant flow passage 62 is provided therein. A chiller 70 for adjusting the temperature of the refrigerant is connected to an entrance 62a and an exit 62b of the refrigerant flow passage 62. When the refrigerant is supplied from the chiller 70 to the entrance 62a of the refrigerant flow passage 62, it passes through the refrigerant flow passage 62 extending all over the support pedestal 60, is returned from the exit 62b of the refrigerant flow passage 62 to the chiller 70, is cooled to a setting temperature inside the chiller 70, and is then supplied to the entrance 62a of the refrigerant flow passage 62 again. The support pedestal 60 has a plurality of types of through holes 64 to 67 penetrating the support pedestal 60 in the up-down direction. The through hole 64 is a hole through which a power feed terminal 25 of the electrostatic electrode 24 is exposed outside. The through holes 65 are holes through which land groups (jumper lands 46a and ground lands 46b, see FIG. 2) provided in the regions X on the lower surface 30b of the sheet heater 30 are exposed outside. The through holes 66 and 67 allow the reference lands 50a and 50b of the reference heater electrodes 44 to be exposed outside therethrough. Electric insulating cylinders 66a and 67a are inserted in the through holes 66 and 67, respectively. The support pedestal 60 further includes, for example, unillustrated through holes in which lift pins for lifting up the wafer W are moved up and down.

The plasma treatment apparatus 10 further includes an electrostatic-chuck power supply 72, a correction-heater power supply 74, a reference-heater power supply 76, and an RF power supply 79. The electrostatic-chuck power supply 72 is a direct-current power supply, and is connected to the power feed terminal 25 of the electrostatic electrode 24 with a power feeding rod 73 inserted in the through hole 64 being interposed therebetween. The correction-heater power supply 74 is a direct-current power supply, and is connected to the jumper lands 46a and the ground lands 46b in the correction heater electrodes 34 with connection flexible printed circuit boards (connection FPC) 75 serving as metal-wiring assembly inserted in the through holes 65 being interposed therebetween. Specifically, since the jumper lands 46a and the ground lands 46b belonging to the same group illustrated in FIG. 2 are arranged in the same region X, they are connected through one connection FPC 75. The connection FPC 75 is a cable in which metal wires 75a and 75b coveted with resin coating are bundled in the form of band, and in an end portion opposed to the region X, the metal wires 75a and 75b are exposed. The metal wires 75a are lead wires that connect the jumper lands 46a to a positive electrode of the correction-heater power supply 74, and the metal wires 75b are lead wires that connect the ground lands 46b to a negative electrode of the correction-heater power supply 74. The reference-heater power supply 76 is an alternating-current power supply, is connected to one reference land 50a of each of the reference heater electrodes 44 through a cable terminal 77 inserted in the through hole 66, and is connected to the other reference land 50b of the reference heater electrode 44 through a cable terminal 78 inserted in the through hole 67. The RF power supply 79 is a power supply for plasma generation, and is connected to supply high-frequency power to the support pedestal 60 functioning as an anode plate. The shower head 14 functioning as the cathode plate is grounded through a variable resistor.

Figure 3:
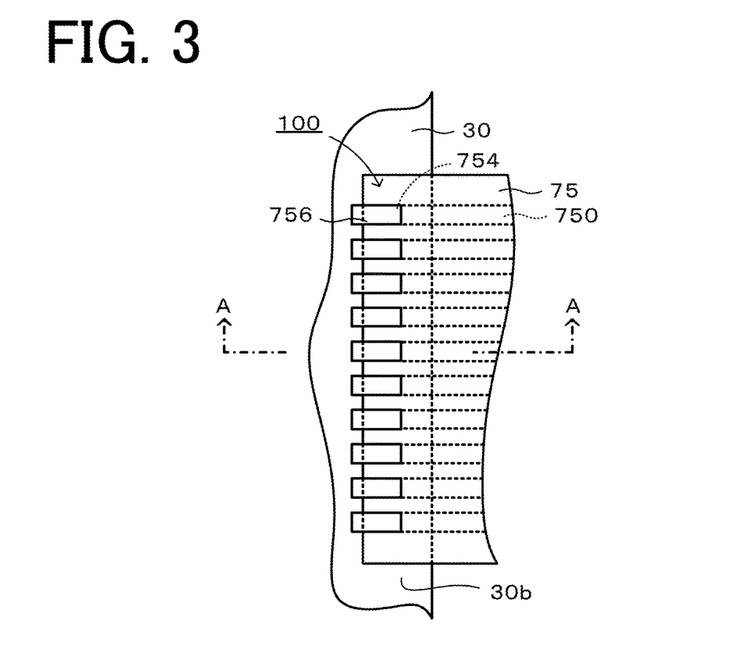
FIG. 3 is a plan view of a metal wiring bonding structure 100 when viewed from a lower surface 30b of the sheet heater 30.
Figure 4:
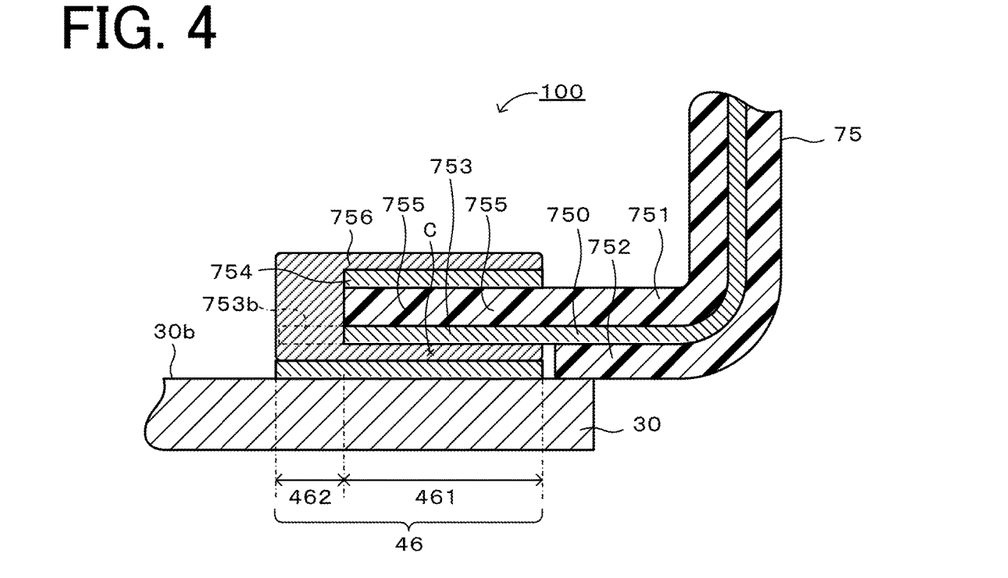
FIG. 4 is a cross-sectional view taken along line A-A of FIG. 3.

Here, a metal wiring bonding structure 100 for the sheet heater 30 and the connection FPC 75 will be described with reference to FIGS. 3 and 4. FIG. 3 is a plan view of the metal wiring bonding structure 100, when viewed from the lower surface 30b of the sheet heater 30, and FIG. 4 is a cross-sectional view taken along line A-A of FIG. 3. For convenience, the jumper lands 46a and the ground lands 46b are not distinguished, but are simply referred to as heater lands 46, and the metal wires 75a and 75b are also not distinguished, but are referred to as metal wires 750. The connection FPC 75 is a flat wire material formed by covering a plurality of metal wires 750 with resin. Specifically, the connection FPC 75 has a plurality of metal wires 750 between a support layer 751 formed of resin and a covering layer 752 formed of resin. Contacts 753 serving as end portions of the metal wires 750 are exposed from the covering layer 752. The sheet heater 30 includes a plurality of heater lands 46 (46a, 46b) exposed in the regions X on the lower surface 30b (see FIG. 2). The heater lands 46 respectively include extended surfaces 462 opposed to imaginary extended portions 753b imaginarily extended ahead from the contacts 753 in addition to base surfaces 461 opposed to the contacts 753. A solder bonding member 756 covers surfaces of the contact opposed lands 754, a distal end surface of the connection FPC 75, and the extended surfaces 462 of the heater lands 46 in the sheet heater 30, and is filled in a bonding space C between the contacts 753 and the heater lands 46.

A production method for such a metal wiring bonding structure 100 will be described with reference to FIG. 5. FIG. 5 include explanatory views illustrating a production process for the metal wiring bonding structure 100.

Figure 5A:
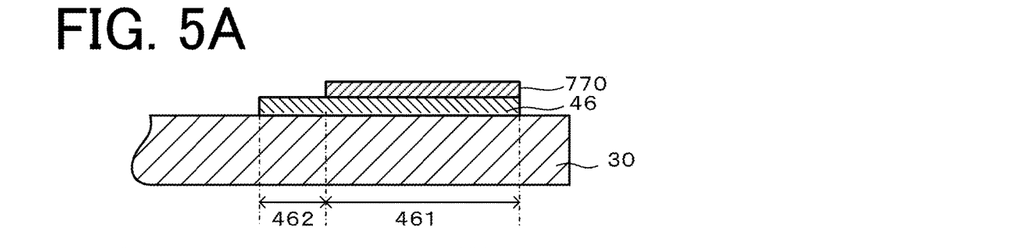
FIGS. 5A to 5D include explanatory views illustrating a production process for the metal wiring bonding structure 100.

First, as illustrated in FIG. 5A, preliminary solder 770 is applied to base surfaces 461 of heater lands 46 on a sheet heater 30. As the preliminary solder 770, for example, solder cream can be used.

Figure 5B:
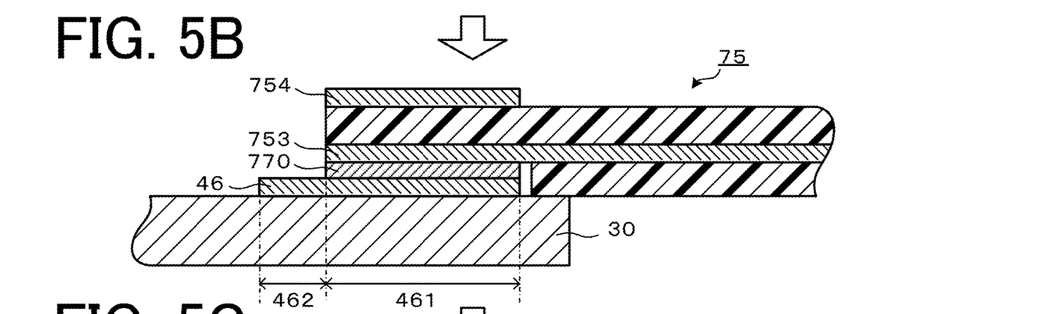
Figure 6A:
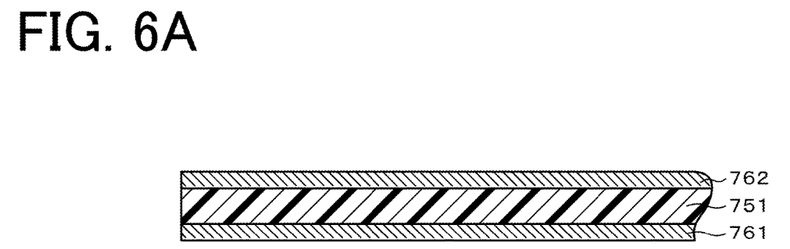
FIGS. 6A to 6C include explanatory views illustrating a production process for a connection FPC 75.
Figure 6B:
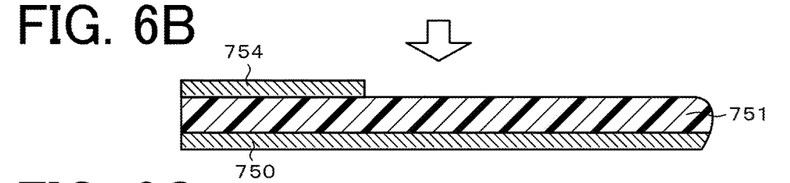
Figure 6C:
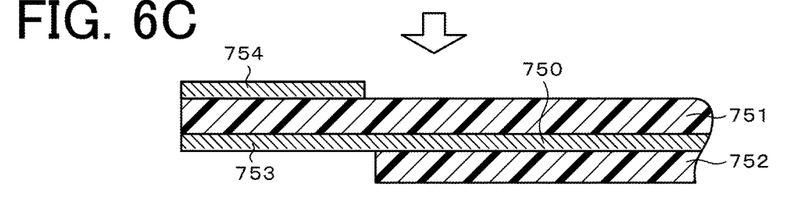

Next, as illustrated in FIG. 5B, a connection FPC 75 is prepared, and is placed in contact with the preliminary solder 770 in a state in which contacts 753 are opposed to the heater lands 46. The connection FPC 75 is prepared through the following procedure. FIG. 6 include explanatory views illustrating a production process for the connection FPC 75. First, a double-sided copper-foiled support layer in which copper foils 761 and 762 are stuck on both surfaces of a resin support layer 751 is prepared (see FIG. 6A). Instead of the copper foils 761 and 762, other metal foils may be used. Next, metal wires 750 are formed in the copper foil 701 by patterning, and contact opposed lands 754 are formed in the copper foil 762 by patterning (see FIG. 6B). As the method for pattern formation, a wet etching method can be used. Next, the metal wires 750 are covered with a resin covering layer 752. AS the method for covering by the resin covering layer 752, a laminating method can be used. However, contacts 753 serving as distal end portions of the metal wires 750 are not covered with the covering layer 752, but are exposed outside (see FIG. 6C).

Figure 7A:
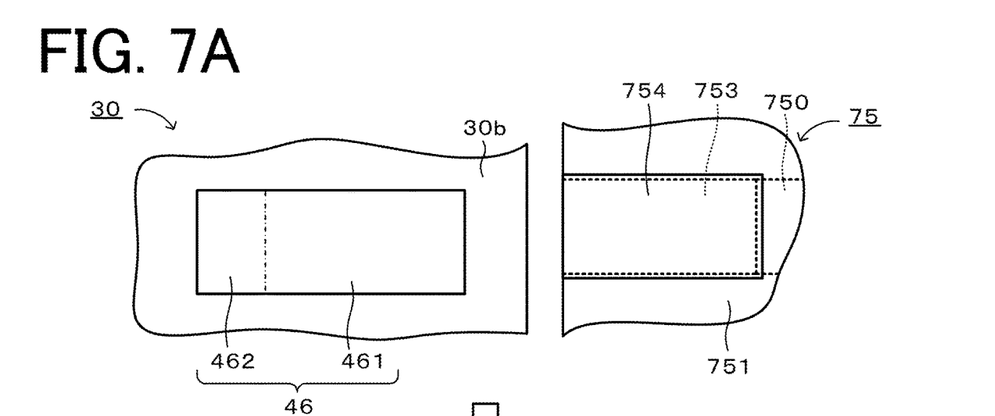
FIGS. 7A to 7C include explanatory views illustrating a process for aligning the connection FPC 75 with the sheet heater 30.
Figure 7B:
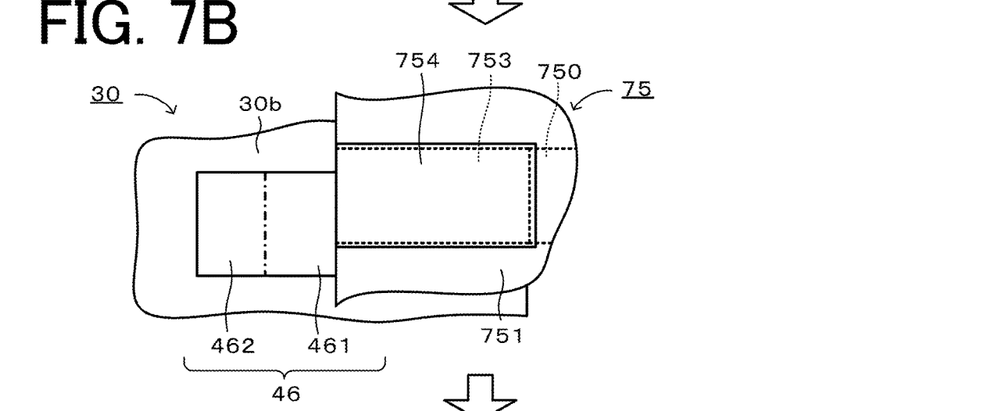
Figure 7C:
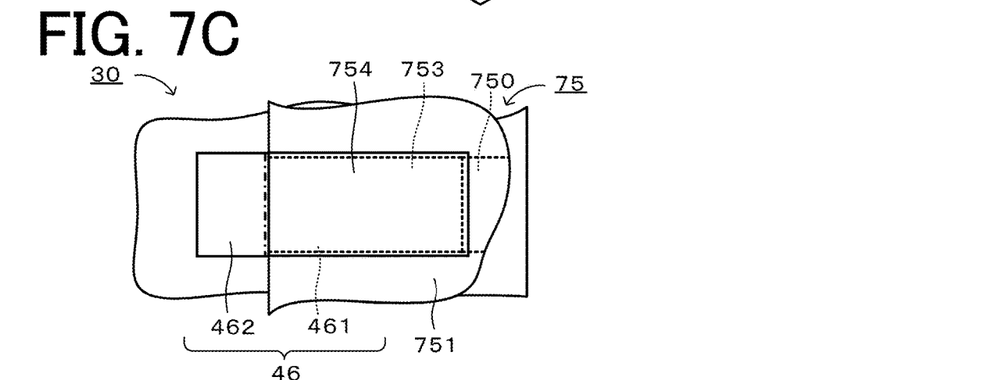

With reference to FIG. 7, a detailed description will now be given of an operation of placing the connection FPC 75 in contact with the preliminary solder 770 in a state in which the contacts 753 of the connection FPC 75 are opposed to the heater lands 46, as illustrated in FIG. 5B. FIG. 7 illustrate a manner in which one contact 753 of the connection FPC 75 is aligned with one heater land 46 from above in a state in which the lower surface 30b of the sheet heater 30 faces upward. A one-dot chain line is an imaginary line that divides the heater land 46 into a base surface 461 and an extended surface 462. For convenience, illustration of the preliminary solder 770 is omitted. The operator moves the connection FPC 75 closer to the sheet heater 30 from a separate state (see FIG. 7A) so that the contact opposed land 754 of the connection FPC 75 overlaps with the heater land 46 exposed from the lower surface 30b of the sheet heater 30 (see FIG. 7B). Then, the operator places the contact opposed land 754 to cover the base surface 461 of the heater land 46 (see FIG. 7C). At this time, the contact opposed land 754 and the heater land 46 are placed so that the rectangle of the contact opposed land 754 and the rectangle surrounding the extended surface 462 of the heater land 46 are combined to form one rectangle. Thus, the contact 753 provided on the back side of the contact opposed land 754 is opposed to the base surface 461 having the same size as that of the contact 753.

Figure 5C:
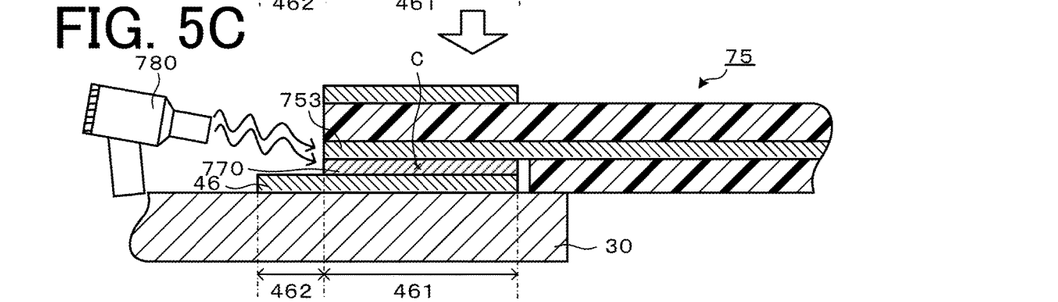

Next, as illustrated in FIG. 5C, the preliminary solder 770 is melted by applying heat from hot air of a spot heater 780, and is then hardened by cooling. The sheet heater 30 and the connection FPC 75 are thereby temporarily bonded. In many cases, a sufficient amount of preliminary solder 770 to fill the bonding space C between the contacts 753 and the heater lands 46 is not ensured, or the preliminary solder 770 is not sufficiently melted because heat from the spot heater 780 does not spread over the entire preliminary solder 770. For this reason, the contacts 753 and the heater lands 46 cannot be firmly soldered only with the preliminary solder 770.

Figure 5D:
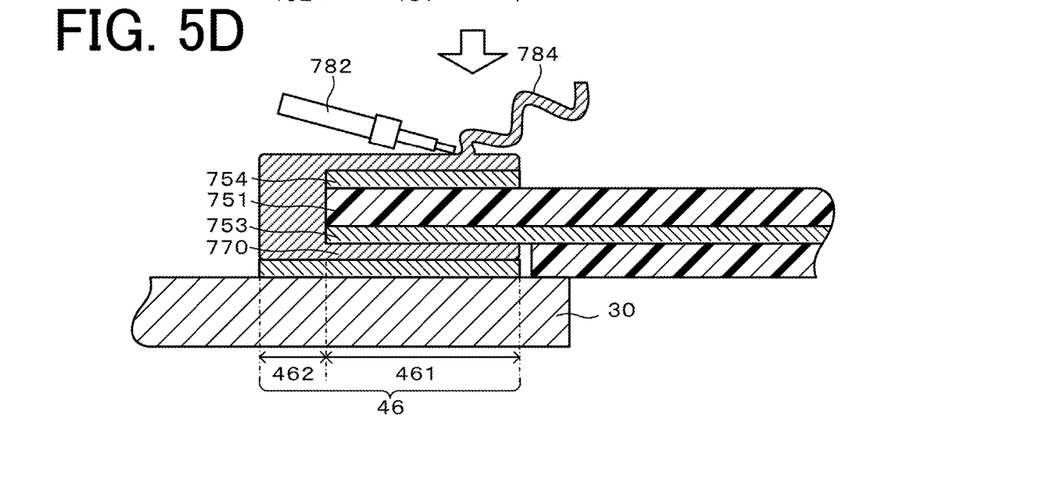

Next, as illustrated in FIG. 5D, wire solder 784 is melted with a soldering iron 782 while being pressed against upper surfaces of the contact opposed lands 754. Here, the contact opposed lands 754 extend to the distal end surface of the connection FPC 75. For this reason, the melted solder is easily supplied from the contact opposed lands 754 to the bonding space C via the distal end surface of the connection FPC 75 and the extended surfaces 462 of the heater lands 46. After that, the melted solder is hardened. Therefore, the melted solder is hardened into a solder bonding member 756. This solder bonding member 756 covers the surfaces of the contact opposed lands 754, the distal end surface of the connection FPC, and the extended surfaces 462 of the heater lands 46, and is filled in the bonding space C.

Next, a description will be given of a usage example of the plasma treatment apparatus 10 thus configured. First, a wafer W is placed on the wafer mounting surface 22a of the electrostatic chuck 22. Then, the inside of the vacuum chamber 12 is adjusted to a predetermined vacuum degree by being depressurized by a vacuum pump. A coulomb force or a Johnson-Rahbeck force is generated by applying a direct-current voltage to the electrostatic electrode 24 of the electrostatic chuck 22, and the wafer W is thereby attracted and fixed to the wafer mounting surface 22a of the electrostatic chuck 22. Next, the inside of the vacuum chamber 12 is made into a process gas atmosphere with a predetermined pressure (for example, several tens of pascals to several hundreds of pascals). By applying a high-frequency voltage between the shower head 14 and the support pedestal 60 in this state, plasma is generated. The surface of the wafer W is etched by the generated plasma. Meanwhile, an unillustrated controller performs control so that the temperature of the wafer W reaches a predetermined target temperature. Specifically, the controller receives a detection signal from a temperature measuring sensor (not illustrated) for measuring the temperature of the wafer W, and controls the current to be supplied to the reference heater electrodes 44, the current to be supplied to the correction heater electrodes 34, and the temperature of the refrigerant to circulate in the refrigerant flow passage 62 so that the measured temperature of the wafer W coincides with the target temperature. In particular, the controller finely controls the current to be supplied to the correction heater electrodes 34 so that a temperature distribution does not occur in the wafer W. The temperature measuring sensor may be embedded in the resin sheet 32 or may be bonded to the surface of the resin sheet 32.

The corresponding relations between the constituent elements of the embodiment and the constituent elements of the present invention will now be clarified. The connection FPC 75 of the embodiment corresponds to the first member of the present invention, the sheet heater 30 corresponds to the second member, and the solder bonding member 756 corresponds to the bonding member. Also, the support layer 751 of the connection FPC 75 corresponds to the first support layer, the covering layer 752 corresponds to the first covering layer, the metal wires 750 correspond to the first metal wires, the contacts 753 correspond to the first contacts, and the contact opposed lands 754 correspond to the first contact opposed lands. The resin sheet 32 of the sheet heater 30 corresponds to the second support layer, and the heater lands 46 correspond to the second contacts.

According to the above-described metal wiring bonding structure 100, the portions of the solder bonding member 756 that cover the surfaces of the contact opposed lands 754 and the distal end surface of the connection FPC 75 can be inspected from the outside. Hence, the connection state can be easily checked, and solder bonding members in a good connection state can be selected. Also, when the contacts 753 of the connection FPC 75 are positioned to be opposed to the heater lands 46 of the sheet heater 30, they can be easily positioned by utilizing the contact opposed lands 754 and the extended surfaces 462 of the heater lands 46, as described above. In this way, solder bonding members 756 in the good connection state can be selected by inspection from the outside, and the contacts 753 and the heater lands 46 can be easily aligned. For this reason, it is possible to provide the metal wiring bonding structure 100 in which the connection FPC 75 having the contacts 753 and the sheet heater 30 having the heater lands 46 are properly bonded.

It is needless to say that the present invention is not limited to the above-described embodiment and can be carried out in various embodiments as long as they belong to the technical scope of the invention.

Figure 8A:
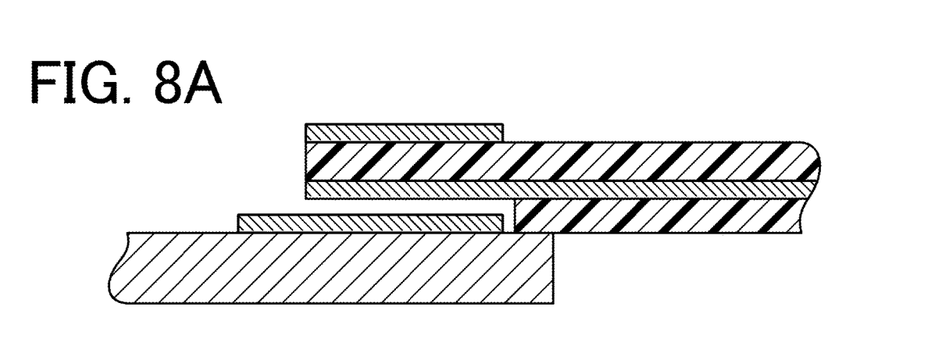
FIGS. 8A and 8B include explanatory views illustrating another production process for the metal wiring bonding structure 100.
Figure 8B:
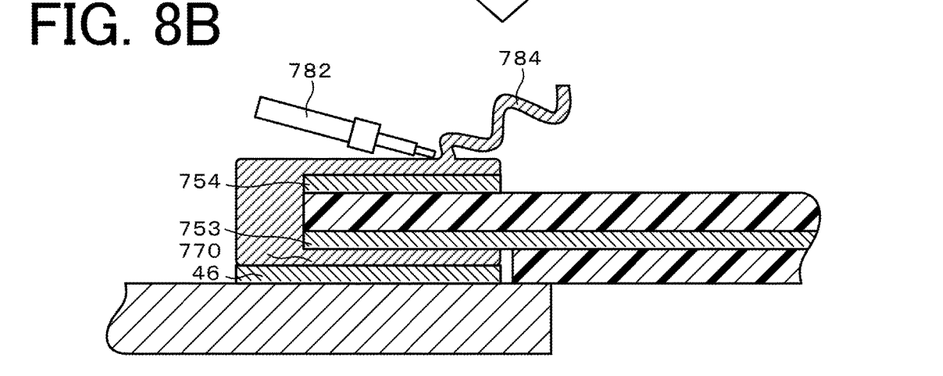

While the contacts 753 of the connection FPC 75 and the heater lands 46 of the sheet heater 30 are temporarily bonded with the preliminary solder 770 in the above-described embodiment, they do not particularly need to be temporarily bonded with the preliminary solder 770. FIG. 8 show an example. First, as illustrated in FIG. 8A, the bonding space C is made empty. At this time, the contacts 753 of the connection FPC 75 and the base surfaces 461 of the heater lands 46 of the sheet heater 30 are preferably fixed, for example, with a tape or a jig (not illustrated) so as not to deviate from the positions opposed to each other. Next, as illustrated in FIG. 8B, wire solder 784 is melted by the soldering iron 782 while being pressed against the upper surfaces of the contact opposed lands 754, and the melted solder is supplied from the contact opposed lands 754 to the bonding space C via the distal end surface of the connection FPC 75. After that, a metal wiring bonding structure 100 is completed by hardening the melted solder. In this case, similarly to the above-described embodiment, solder bonding members 756 in a good connection state can be selected by inspection from the outside, and the contacts 753 and the heater lands 46 can be easily aligned with each other.

While the connection FPC 75 is provided as the first member and the sheet heater 30 is provided as the second member in the above-described embodiment, the present invention is not particularly limited to this combination. For example, a flat cable may be used as the first member, and a printed wiring board may be used as the second member.

What is claimed is:

1. A metal wiring bonding structure including:
   a first member having a plurality of first metal wires between a first support layer formed of resin and a first covering layer formed of resin, and first contacts serving as end portions of the first metal wires and exposed from the first covering layer;
   a second member having a plurality of second contacts on a surface of a second support layer formed of resin, the second contacts being respectively disposed opposed to the plurality of first contacts; and
   a bonding member that brazes and solders the first contacts and the second contacts,
   wherein the first member includes first contact opposed lands formed of metal and disposed at positions respectively opposed to the plurality of first contacts on a surface of the first support layer opposite from a surface on which the first metal wires are provided,
   the second contacts respectively include extended surfaces opposed to imaginary extended portions imaginarily extended ahead from the first contacts in addition to base surfaces opposed to the first contacts, and
   the bonding member covers surfaces of the first contact opposed lands, a distal end surface of the first member, and the extended surfaces of the second contacts, and is filled in a bonding space between the first contacts and the second contacts.

2. The metal wiring bonding structure according to claim 1,
   wherein the first contact opposed lands extend to the distal end surface of the first member.

3. The metal wiring bonding structure according to claim 1,
   wherein the first member is a flexible printed circuit board.

4. The metal wiring bonding structure according to claim 1,
   wherein the second member is a sheet heater functioning as a heater and disposed between an electrostatic chuck and a support pedestal formed of metal, and
   the first member is inserted in a through hole of the support pedestal to be bonded to the second member.

5. A production method for a metal wiring bonding structure, including the steps of;
(a) a step of preparing:
a first member having a plurality of first metal wires between a first support layer formed of resin and a first covering layer formed of resin, first contacts serving as end portions of the first metal wires and exposed from the first covering layer, and first contact opposed lands formed of metal and disposed at positions respectively opposed to the plurality of first contacts on a surface of the first support layer opposite from a surface on which the first metal wires are provided, and
a second member having a plurality of second contacts on a surface of a second support layer formed of resin, the second contacts respectively including extended surfaces opposed to imaginary extended portions imaginarily extended ahead from the first contacts in addition to base surfaces opposed to the first contacts when the second contacts are opposed to the first contacts,
(b) a step of placing the first member on the second member and aligning the first member and the second member so that the first contacts are opposed to the base surfaces of the second contacts by utilizing the first contact opposed lands and the extended surfaces of the second contacts,
(c) a step of heating and melting a brazing and soldering material in contact with the first contact opposed lands, supplying the melted brazing and soldering material from the first contact opposed lands to a bonding space between the first contacts and the second contacts through a distal end surface of the first member and the extended surfaces of the second contacts, and in case the first contacts and the second contacts are temporarily bonded with a preliminary brazing and soldering material beforehand, melting the preliminary brazing and soldering material by heat transfer; and
(d) a step of hardening the entire brazing and soldering material.

* * * * *